United States Patent
Jang et al.

(10) Patent No.: US 9,461,029 B2
(45) Date of Patent: Oct. 4, 2016

(54) SEMICONDUCTOR PACKAGES AND METHODS FOR FABRICATING THE SAME

(71) Applicants: Hye-young Jang, Yongin-si (KR); Chang-Seong Jeon, Yongin-si (KR); Chajea Jo, Incheon (KR); Taeje Cho, Yongin-si (KR)

(72) Inventors: Hye-young Jang, Yongin-si (KR); Chang-Seong Jeon, Yongin-si (KR); Chajea Jo, Incheon (KR); Taeje Cho, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/744,031

(22) Filed: Jun. 19, 2015

(65) Prior Publication Data

US 2015/0380394 A1 Dec. 31, 2015

(30) Foreign Application Priority Data

Jun. 27, 2014 (KR) ........................ 10-2014-0080054

(51) Int. Cl.
*H01L 21/50* (2006.01)
*H01L 25/00* (2006.01)
(Continued)

(52) U.S. Cl.
CPC ............... *H01L 25/50* (2013.01); *H01L 24/81* (2013.01); *H01L 24/83* (2013.01); *H01L 24/92* (2013.01); *H01L 25/0657* (2013.01); *H01L 23/3128* (2013.01); *H01L 25/18* (2013.01); *H01L 2224/16146* (2013.01); *H01L 2224/16227* (2013.01); *H01L 2224/83203* (2013.01); *H01L 2224/9211* (2013.01); *H01L 2225/06513* (2013.01); *H01L 2225/06517* (2013.01); *H01L 2225/06541* (2013.01); *H01L 2225/06555* (2013.01); *H01L 2225/06589* (2013.01); *H01L 2924/1434* (2013.01); *H01L 2924/15311* (2013.01)

(58) Field of Classification Search
CPC ... H01L 25/50; H01L 25/0657; H01L 25/18; H01L 24/81
USPC ........................................................ 438/109
See application file for complete search history.

(56) References Cited

U.S. PATENT DOCUMENTS 6,353,263 B1  3/2002  Dotta et al.
6,448,659 B1  9/2002  Lee
(Continued)

FOREIGN PATENT DOCUMENTS

JP  2002-184936 A  6/2002
KR  10-0846096 B1  7/2008
KR  10-1237587 B1  2/2013

*Primary Examiner* — Luan C Thai
(74) *Attorney, Agent, or Firm* — Muir Patent Law, PLLC

(57) ABSTRACT

A semiconductor package may include a first semiconductor chip including a first surface facing a package substrate, a second surface opposite to the first surface, and at least one through-electrode penetrating the first semiconductor chip, a molding layer molding the first semiconductor chip and exposing the second surface of the first semiconductor chip, a second semiconductor chip stacked on the second surface of the first semiconductor chip, and a non-conductive film provided between the first and second semiconductor chips. The second semiconductor chip includes an overhang portion extending past an edge of the first semiconductor chip. For example, a size of the second semiconductor chip may be greater than that of the first semiconductor chip, so the second semiconductor chip has an overhang. The second semiconductor chip includes at least one interconnecting terminal electrically connected to the at least one through-electrode.

20 Claims, 10 Drawing Sheets

(51) Int. Cl.
   *H01L 25/065* (2006.01)
   *H01L 23/00* (2006.01)
   *H01L 25/18* (2006.01)
   *H01L 23/31* (2006.01)

(56) References Cited

U.S. PATENT DOCUMENTS

| | | |
|---|---|---|
| 7,119,426 B2 | 10/2006 | Fukui et al. |
| 7,429,502 B2 | 9/2008 | Archer, III et al. |
| 8,258,007 B2 | 9/2012 | Shen et al. |
| 8,314,483 B2 | 11/2012 | Lin et al. |
| 8,334,170 B2 * | 12/2012 | Wang ............... H01L 24/33 257/621 |
| 8,344,493 B2 | 1/2013 | West et al. |
| 8,446,000 B2 | 5/2013 | Shen et al. |
| 8,604,615 B2 * | 12/2013 | Lee ............... H01L 23/3128 257/685 |
| 2008/0265432 A1 | 10/2008 | O et al. |
| 2010/0237481 A1 | 9/2010 | Chi et al. |
| 2011/0304015 A1 | 12/2011 | Kim et al. |
| 2012/0171814 A1 | 7/2012 | Choi et al. |
| 2013/0078765 A1 | 3/2013 | Lin et al. |
| 2013/0082399 A1 | 4/2013 | Kim et al. |
| 2013/0099368 A1 | 4/2013 | Han |
| 2013/0105972 A1 | 5/2013 | Tam et al. |
| 2013/0122656 A1 | 5/2013 | Tomita et al. |
| 2013/0127049 A1 | 5/2013 | Wang et al. |

* cited by examiner

SEMICONDUCTOR PACKAGES AND METHODS FOR FABRICATING THE SAME

CROSS-REFERENCE TO RELATED APPLICATION

This U.S. non-provisional patent application claims priority under 35 U.S.C. §119 to Korean Patent Application No. 10-2014-0080054, filed on Jun. 27, 2014, in the Korean Intellectual Property Office, the disclosure of which is hereby incorporated by reference in its entirety.

BACKGROUND

High-capacity, thin, and small semiconductor devices and electronic products using the same are increasing demand, and various packaging techniques relative thereto have been developed. According to one of the various packaging techniques, various semiconductor chips may be vertically stacked to realize a high-density chip stack. By this technique, semiconductor chips having various functions may be integrated in a small sized semiconductor package.

SUMMARY

Embodiments of the inventive concepts may provide semiconductor packages capable of overcoming overhangs even though a large-sized semiconductor chip may be stacked on a small-sized semiconductor chip, and methods for fabricating the same. Embodiments are also be applicable to improving packaging of semiconductor chips where an upper chip does not have an overhang with respect to a lower chip on which it is stacked.

Embodiments of the inventive concepts may also provide semiconductor packages capable of realizing a fine pitch of terminals electrically connecting stacked semiconductor chips to each other and of minimizing occurrence of an electrical short, and methods for fabricating the same.

Embodiments of the inventive concepts may also provide semiconductor packages capable of improving a heat release characteristic and methods for fabricating the same.

In an aspect, a semiconductor package may include: a first semiconductor chip mounted on a package substrate, the first semiconductor chip comprising: a first surface facing the package substrate; a second surface opposite to the first surface; and at least one through-electrode penetrating the first semiconductor chip; a molding layer disposed on the package substrate to mold the first semiconductor chip, the molding layer exposing the second surface of the first semiconductor chip; a second semiconductor chip stacked on the second surface of the first semiconductor chip, the second semiconductor chip having a size greater than that of the first semiconductor chip and having an overhang protruding toward an outside of the first semiconductor chip, and the second semiconductor chip comprising at least one interconnecting terminal electrically connected to the at least one through-electrode; and a non-conductive film provided between the first semiconductor chip and the second semiconductor chip. The non-conductive film may include an extending portion that further protrudes beyond the overhang of the second semiconductor chip toward an outside of the second semiconductor chip, and the extending portion of the non-conductive film may be supported by the molding layer.

In some embodiments, the at least one through-electrode may be disposed in a central region of the first semiconductor chip.

In some embodiments, the semiconductor package may further include: at least one second interconnecting terminal disposed between the first semiconductor chip and the package substrate and connected to the at least one through-electrode. The at least one second interconnecting terminal may electrically connect the first semiconductor chip to the package substrate.

In some embodiments, the at least one interconnecting terminal may be disposed in a central region of the second semiconductor chip, and the at least one interconnecting terminal may be vertically aligned with the at least one through-electrode.

In some embodiments, the semiconductor package may further include: a second molding layer covering one or more sidewalls of the second semiconductor chip.

In some embodiments, the semiconductor package may further include: a heat transfer layer provided on the second semiconductor chip; and a heat radiating layer provided on the heat transfer layer.

In some embodiments, the semiconductor package may further include: a heat transfer layer surrounding the second semiconductor chip; and a heat radiating layer provided on the heat transfer layer.

In some embodiments, the semiconductor package may further include: a third semiconductor chip stacked on the second semiconductor chip. The second semiconductor chip may include: a first surface facing the first semiconductor chip, a second surface opposite thereto, and at least one second through-electrode penetrating the second semiconductor chip. The third semiconductor chip may include at least one second interconnecting terminal that is electrically connected to the at least one second through-electrode.

In an aspect, a semiconductor package may include: a first semiconductor chip having a first front surface and a first back surface, the first semiconductor chip mounted on a package substrate in such a way that the first front surface faces the package substrate; a second semiconductor chip having a second front surface and a second back surface, the second semiconductor chip stacked on the first semiconductor chip in such a way that the second front surface faces the first back surface; a molding layer provided on the package substrate to mold the first semiconductor chip, the molding layer exposing the first back surface; and a non-conductive film provided between the first back surface and the second front surface and supported by the first back surface. A size of the second semiconductor chip may be greater than that of the first semiconductor chip such that the second semiconductor chip may have an overhang protruding toward an outside of the first semiconductor chip. The molding layer may have a surface substantially coplanar with the first back surface. A size of the non-conductive film may be greater than that of the second front surface such that the non-conductive film may have an extended portion that extends onto the surface of the molding layer that may be supported by the surface of the molding layer.

In some embodiments, the first semiconductor chip may include through-electrodes that penetrate the first semiconductor chip so as to be electrically connected to the package substrate, and the second semiconductor chip may include interconnecting terminals that are disposed on the second front surface so as to be electrically connected to the through-electrodes.

In some embodiments, the through-electrodes may be provided in a central region of the first semiconductor chip, the interconnecting terminals may be provided in a central region of the second semiconductor chip, and the interconnecting terminals may be vertically aligned with the through-electrodes.

In some embodiments, the non-conductive film may fill a space between the first back surface and the second front surface, and the interconnecting terminals may penetrate the non-conductive film so as to be connected to the through-electrodes.

In some embodiments, the molding layer may fill a space between the package substrate and the first front surface and may surround a sidewall of the first semiconductor chip.

In some embodiments, the semiconductor package may further include: an underfill layer exposing the second back surface and surrounding the second semiconductor chip.

In some embodiments, the first front surface and the second front surface may be active surfaces, and the first back surface and the second back surface may be non-active surfaces.

In some embodiments, the semiconductor package may further include: a third semiconductor chip having a third front surface and a third back surface, the third semiconductor chip stacked on the second semiconductor chip in such a way that the third front surface faces the second back surface; and a second non-conductive film provided between the third front surface and the second back surface and supported by the second back surface. The second semiconductor chip may include second through-electrodes penetrating the second semiconductor chip, and the third semiconductor chip may include interconnecting terminals that are provided on the third front surface so as to be electrically connected to the second through-electrodes.

In an aspect, a semiconductor package may include: a non-memory chip comprising: a first active surface; a first non-active surface opposite to the first active surface; and through-electrodes penetrating the non-memory chip, the non-memory chip mounted on a printed circuit board in such a way that the first active surface faces the printed circuit board; a memory chip comprising: a second active surface on which interconnecting terminals electrically connected to the through-electrodes are provided; and a second non-active surface opposite to the second active surface, the memory chip mounted on the non-memory chip in such a way that the second active surface faces the first non-active surface; a molding layer provided on the printed circuit board to mold the non-memory chip, the molding layer having a surface coplanar with the first non-active surface; and a non-conductive film provided between the non-memory chip and the memory chip and supported by the first non-active surface, a size of the non-conductive film greater than that of the second active surface. The memory chip may have an overhang protruding from a sidewall of the non-memory chip, the non-conductive film may have an extending portion further protruding beyond the overhang toward an outside of the memory chip, and the extending portion of the non-conductive film may be supported by the surface of the molding layer.

In some embodiments, the non-memory chip may be an application processor (AP).

In some embodiments, the semiconductor package may further include: an underfill layer surrounding a sidewall of the memory chip and exposing the second non-active surface.

In some embodiments, the semiconductor package may further include: a heat transfer layer and a heat radiating layer sequentially stacked on the second non-active surface.

In an aspect, a method for fabricating a semiconductor package may include: mounting a first semiconductor chip on a package substrate, the first semiconductor chip comprising: a first front surface; a first back surface opposite to the first front surface; and through-electrodes penetrating the first semiconductor chip; forming a molding layer on the package substrate, the molding layer encapsulating the first semiconductor chip and exposing the first back surface of the first semiconductor chip; stacking a second semiconductor chip on the first semiconductor chip, the second semiconductor chip comprising: a second front surface; a second back surface opposite to the second front surface; and interconnecting terminals provided on the second front surface; providing a non-conductive film between the second front surface of the second semiconductor chip and the first back surface of the first semiconductor chip; and electrically connecting the second semiconductor chip to the first semiconductor chip by thermally compressing the non-conductive film. A size of the second semiconductor chip may be greater than that of the first semiconductor chip such that the second semiconductor chip may have an overhang protruding from a sidewall of the first semiconductor chip. The thermally compressed non-conductive film may further protrude beyond the overhang of the second semiconductor chip from the sidewall of the first semiconductor chip so as to be supported by the molding layer.

In some embodiments, mounting the first semiconductor chip may include: mounting the first semiconductor chip on the package substrate by a face-down mounting method in such a way that the first front surface faces the package substrate. The first semiconductor chip may be electrically connected to the package substrate through the through-electrodes.

In some embodiments, mounting the first semiconductor chip may further include: providing interconnecting terminals, which are connected to the through-electrodes, between the first semiconductor chip and the package substrate.

In some embodiments, forming the molding layer may include: forming an open-type molding layer filling a space between the package substrate and the first semiconductor chip. The open-type molding layer may surround a sidewall of the first semiconductor chip and may expose the first back surface. The open-type molding layer may have a surface coplanar with the first back surface.

In some embodiments, the thermally compressed non-conductive film may include an extending portion extending onto the surface of the open-type molding layer, and the extending portion may be supported by the surface of the open-type molding layer.

In some embodiments, stacking the second semiconductor chip may include: stacking the second semiconductor chip on the first back surface by a face-down mounting method in such a way that the second front surface faces the first back surface.

In some embodiments, providing the non-conductive film may include: adhering a non-conductive adhesive film, which has a thickness greater than a protruding length of the interconnecting terminals, to the second front surface.

In some embodiments, electrically connecting the second semiconductor chip to the first semiconductor chip may include: electrically connecting the interconnecting terminals to the through-electrodes by thermally compressing the non-conductive adhesive film. The interconnecting terminals may penetrate the thermally compressed non-conductive adhesive film so as to be connected to the through-electrodes.

In some embodiments, a size of the thermally compressed non-conductive adhesive film may be greater than that of the second semiconductor chip such that the thermally compressed non-conductive adhesive film may have an extending portion protruding beyond the overhang, and the extending portion may be supported by the molding layer.

In some embodiments, the method may further include: forming an underfill layer on the molding layer. The underfill layer may surround a sidewall of the second semiconductor chip and may expose the second back surface.

In some embodiments, the method may further include: forming a heat transfer layer on the second back surface; and forming a heat radiating layer on the heat transfer layer.

In some embodiments, the method may further include: forming a heat transfer layer surrounding the second semiconductor chip on the molding layer; and forming a heat radiating layer on the heat transfer layer.

In some embodiments, the second semiconductor chip may further include second through-electrodes penetrating the second semiconductor chip. In this case, the method may further include: stacking a third semiconductor chip on the second semiconductor chip, the third semiconductor chip comprising: a third front surface; a third back surface opposite to the third front surface; and second interconnecting terminals disposed on the third front surface; providing a second non-conductive film between the second back surface of the second semiconductor chip and the third front surface of the third semiconductor chip; and electrically connecting the third semiconductor chip to the second semiconductor chip by thermally compressing the second non-conductive film.

In some embodiments, stacking the third semiconductor chip may include: stacking the third semiconductor chip on the second back surface by a face-down mounting method in such a way that the third front surface faces the second back surface.

In some embodiments, electrically connecting the third semiconductor chip to the second semiconductor chip may include: electrically connecting the second interconnecting terminals to the second through-electrodes by thermally compressing the second non-conductive film. The second interconnecting terminals may penetrate the thermally compressed second non-conductive film so as to be connected to the second through-electrodes.

In some embodiments, the method may further include: forming an underfill layer on the molding layer. The underfill layer may surround sidewalls of the second and third semiconductor chips and may expose the third back surface.

In an aspect, a method for fabricating a semiconductor package may include: providing a package substrate; mounting a non-memory chip on the package substrate, the non-memory chip comprising: a first active surface; a first non-active surface opposite to the first active surface; and through-electrodes penetrating the non-memory chip, and the non-memory chip mounted on the package substrate in such a way that the first active surface faces the package substrate; forming a molding layer encapsulating the non-memory chip on the package substrate, the molding layer having a surface coplanar with the first non-active surface; stacking a memory chip on the first non-active surface of the non-memory chip, the memory chip comprising: a second active surface; interconnecting terminals provided on the second active surface; and a second non-active surface opposite to the second active surface, and a non-conductive film adhered to the second active surface to cover the interconnecting terminals; and electrically connecting the memory chip to the non-memory chip by thermally compressing the non-conductive film. A size of the memory chip may be greater than that of the non-memory chip such that the memory chip may have an overhang protruding from a sidewall of the non-memory chip. A size of the thermally compressed non-conductive film may be greater than that of the memory chip such that the thermally compressed non-conductive film may have an extending portion further protruding from the overhang. The extending portion may extend onto a surface of the molding layer and is supported by the surface of the molding layer.

In some embodiments, the method may further include: forming an underfill layer on the surface of the molding layer. The underfill layer may surround a sidewall of the memory chip and exposes the second non-active surface.

In some embodiments, the method may further include: forming a heat transfer layer on the second non-active surface; and forming a heat radiating layer on the heat transfer layer.

In some embodiments, the method may further include: forming a heat transfer layer molding the memory chip on the surface of the molding layer; and forming a heat radiating layer on the heat transfer layer.

In some examples, methods of manufacturing a semiconductor package comprise mounting a first semiconductor chip on a package substrate; forming a molding material at sides of the first semiconductor chip so that top surfaces of the molding material and the first semiconductor chip lying within 5 um of a first plane; mounting a second semiconductor chip on the first semiconductor chip with a non-conductive film disposed therebetween; and performing a thermal compression to apply pressure and heat to the non-conductive film to allow the non-conductive film to thin and flow onto the molding material.

The second semiconductor chip may comprise solder bumps attached to a bottom surface. Prior to the mounting step, the non-conductive film may be disposed over the solder bumps. During the thermal compression, the solder bumps extend through a surface of the non-conductive film.

The non-conductive film may have a reflow temperature of about or less than 160 degrees Celcius.

The first semiconductor chip may include pads on an upper surface and during the thermal compression, the solder bumps on the second semiconductor chip may be connected to the pads.

The solder bumps of the first semiconductor chip may be connected to the pads through solder bumps on the first semiconductor chip.

The solder bumps of the second semiconductor chip may be directly connected to the pads of the first semiconductor chip.

The molding material may extend from sides of the first semiconductor chip to sides of the package substrate. The sides of the package substrate may be in vertical alignment with sides of the molding material.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1A:
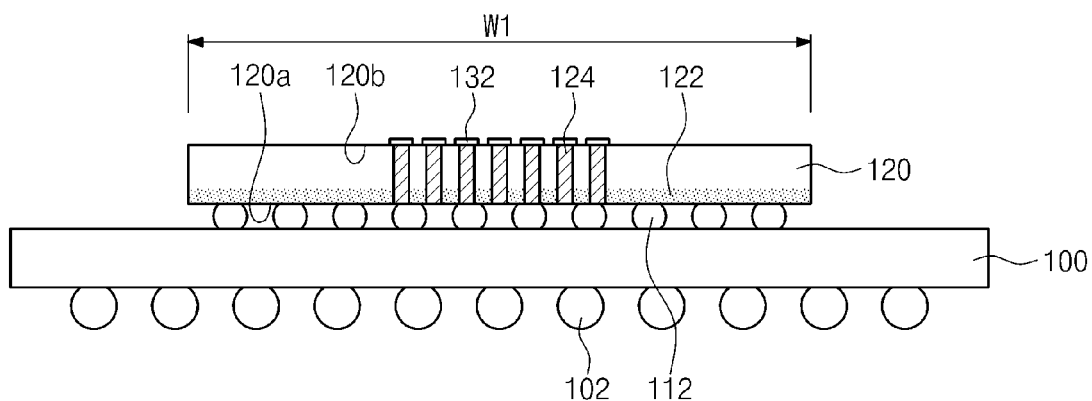
FIGS. 1A to 1D are cross-sectional views illustrating a method for fabricating a semiconductor package according to example embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following example embodiments that will be described in more detail with reference to the accompanying drawings. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, embodiments of the inventive concepts are not limited to the specific examples provided herein and may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to standard manufacturing techniques including acceptable process variations and/or allowable deviations or errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Exemplary embodiments are described herein with reference to cross-sectional illustrations and/or plane illustrations that may be idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2A:
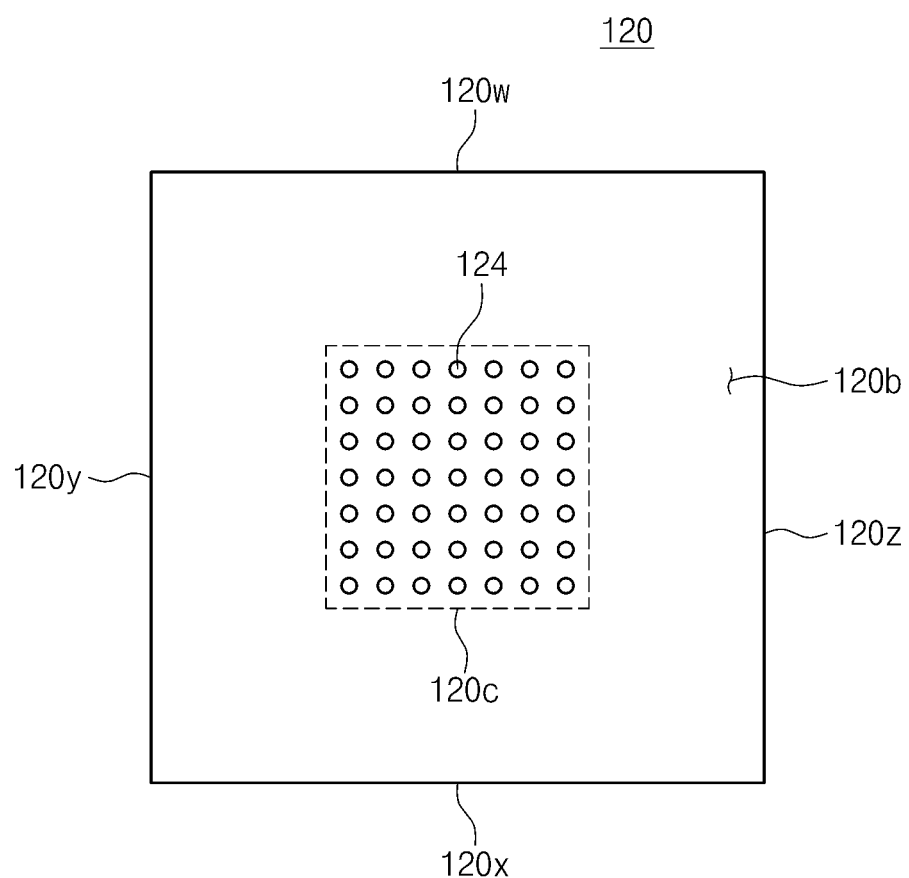
FIG. 2A is a plan view illustrating a portion of FIG. 1A.
Figure 2B:
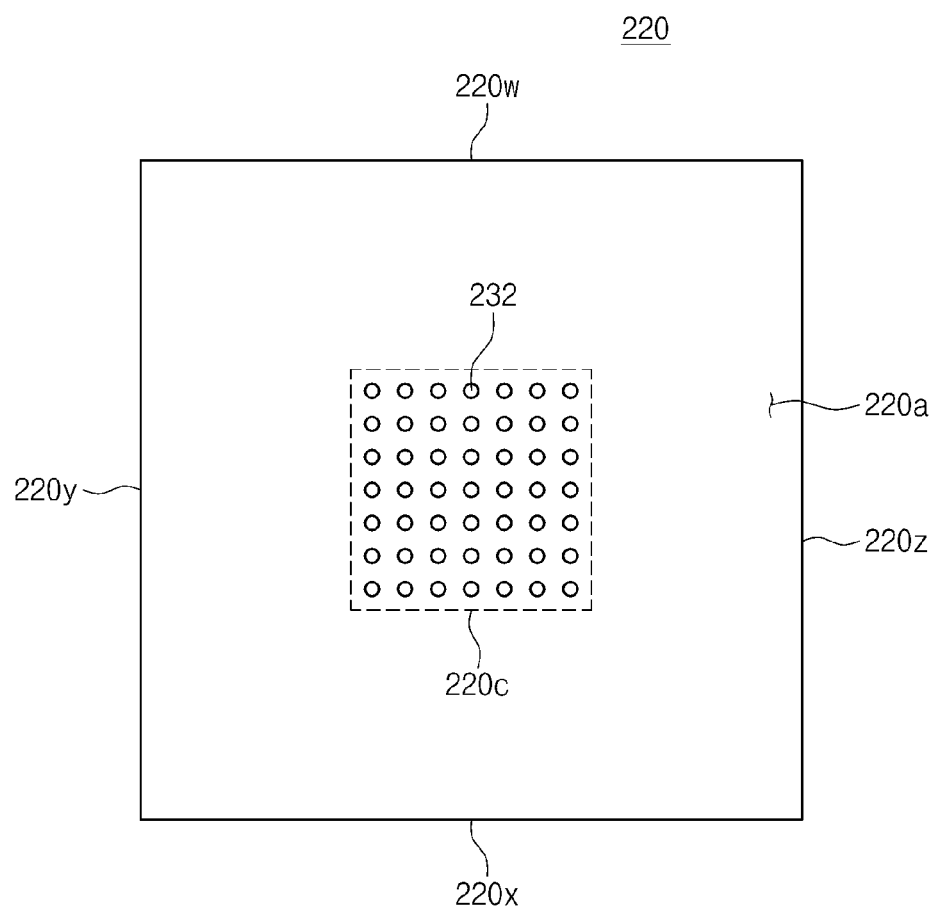
FIG. 2B is a plan view illustrating a portion of FIG. 1C.
Figure 2C:
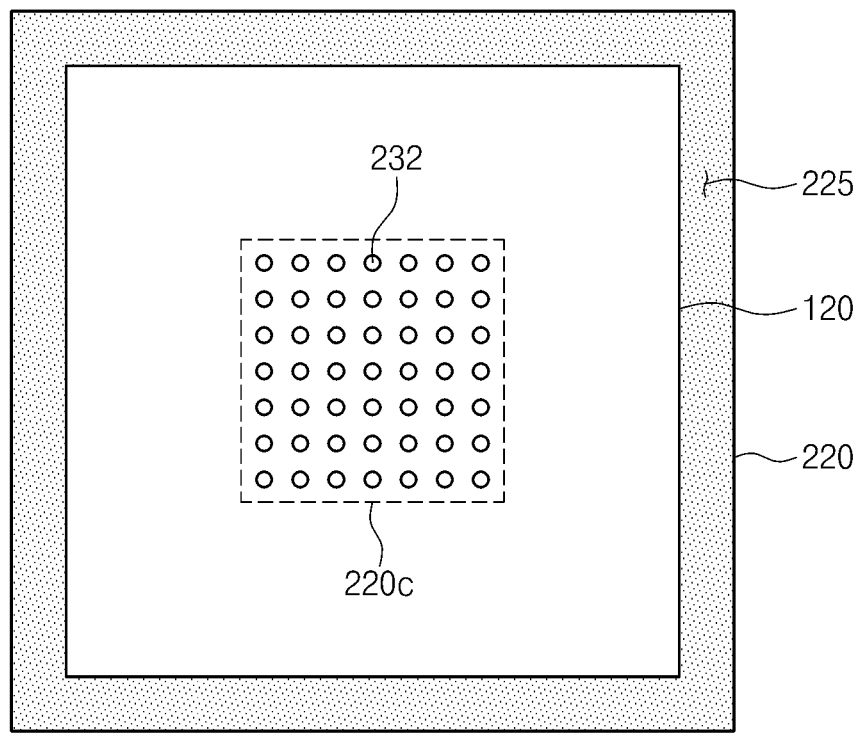
FIG. 2C is a plan view illustrating a portion of FIG. 1D.
Figure 3A:
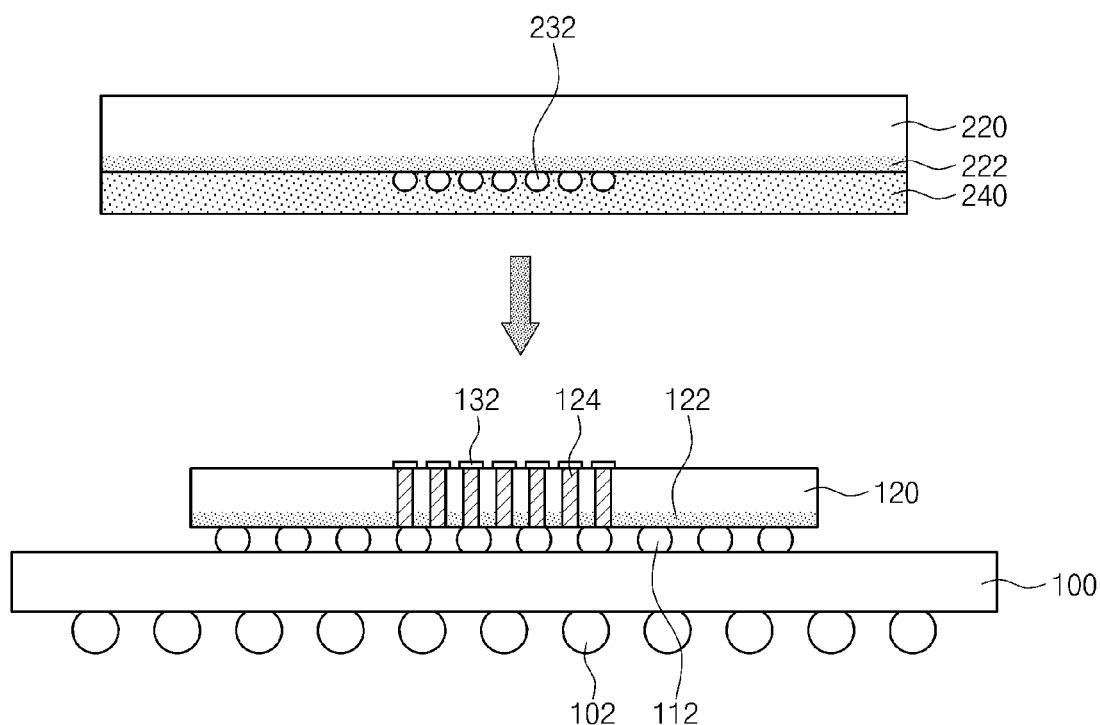
FIGS. 3A and 3B are cross-sectional views to illustrate a method for fabricating a semiconductor package according to a comparison example.
Figure 3B:
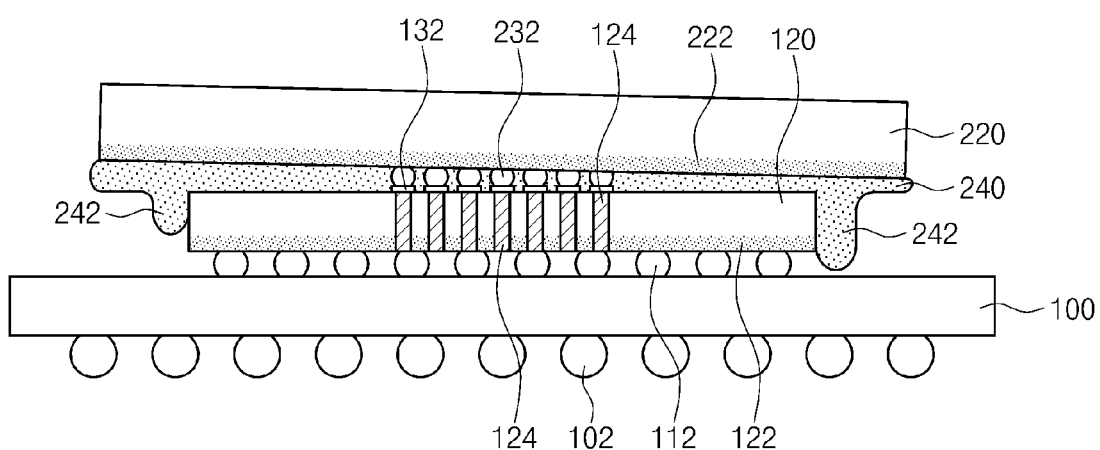

FIGS. 1A to 1D are cross-sectional views illustrating a method for fabricating a semiconductor package according to example embodiments of the inventive concepts. FIG. 2A is a plan view illustrating a portion of FIG. 1A. FIG. 2B is a plan view illustrating a portion of FIG. 1C. FIG. 2C is a plan view illustrating a portion of FIG. 1D. FIGS. 3A and 3B are cross-sectional views illustrating a method for fabricating a semiconductor package according to a comparison example.

Referring to FIG. 1A, a first semiconductor chip 120 may be mounted on a package substrate 100. The package substrate 100 may be, for example, a printed circuit board (PCB). External terminals 102 (e.g., solder bumps such as solder balls) may be bonded to a bottom surface of the package substrate 100. The first semiconductor chip 120 may have an active surface 120a and a non-active surface (e.g., backside surface) 120b on the opposite side of the active surface 120a. A first circuit layer 122 may be formed on the active surface 120a. The first circuit layer 122 may be formed of multiple layers (patterned insulating layers and conductive layers) on a semiconductor substrate (such as on a crystalline substrate of silicon, silicon germanium, etc.), as is typical in manufacturing semiconductor devices. A passivation layer (not shown) may cover the first circuit layer 122. The first semiconductor chip 120 may include through-electrodes 124. The through-electrodes may penetrate the semiconductor substrate without fully penetrating the first semiconductor chip 120 (e.g., extend from the non-active surface 120b through the semiconductor substrate to connect to an interior conductive layer of the first circuit layer 122) or may fully penetrate the first semiconductor chip 120 (e.g., extend from the non-active surface 120b to the active surface 120a). The through-electrodes 124 may be intensively disposed in a central region 120c of the first semiconductor chip 120, as illustrated in FIG. 2A. In some embodiments, the first semiconductor chip 120 may be a non-memory chip such as an application processor.

The first semiconductor chip 120 may have a first width W1. In some embodiments, as illustrated in FIG. 2A, the first semiconductor chip 120 may have four sidewalls 120w, 120x, 120y, and 120z. Here, at least a pair of sidewalls 120w and 120x opposite to each other among the four sidewalls 120w, 120x, 120y, and 120z may have a length equal to the first width W1.

The first semiconductor chip 120 may be mounted in such a way that the active surface 120a faces the package substrate 100. In other words, the first semiconductor chip 120 may be mounted on the package substrate 100 by in a face-down configuration. First interconnecting terminals 112 (e.g., solder bumps such as solder balls or pillars) may be provided between the package substrate 100 and the active surface 120a of the first semiconductor chip 120. The first semiconductor chip 120 may be electrically connected to the package substrate 100 by the first interconnecting terminals 112. Back-surface pads 132 that are electrically connected to the through-electrodes 124 may be provided on the non-active surface 120b of the first semiconductor chip 120. The back-surface pads 132 may be positioned directly over corresponding through-electrodes 124 as shown (e.g., directly connected to corresponding through-electrodes 124) or be connected to corresponding through-electrodes 124 through a redistribution layer (not shown) formed on the non-active surface 120b.

Figure 1B:
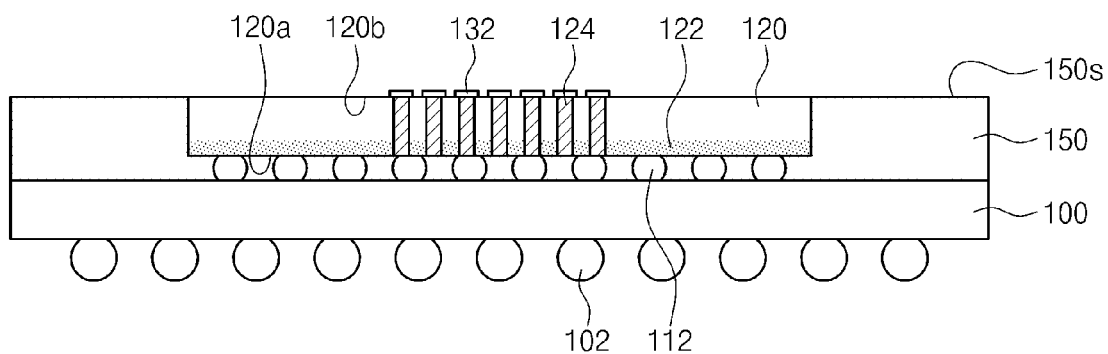

Referring to FIG. 1B, a molding layer 150 partially encapsulating the first semiconductor chip 120 may be formed on the package substrate 100. The molding layer 150 may be formed using a molded under fill (MUF) process. In some embodiments, the molding layer 150 may expose the non-active surface 120b of the first semiconductor chip 120. The non-active surface 120b of the first semiconductor chip 120 may be flush with a top surface 150s of the molding layer 150. In some examples, the non-active surface 120b may be substantially coplanar with a top surface 150s of the molding layer 150. For example, the non-active surface 120b may be within 5 um of the top surface 150s of the molding layer 150. In some examples, all of the non-active surface 120b and the top surface 150s lie within 5 um of a plane.

Figure 1C:
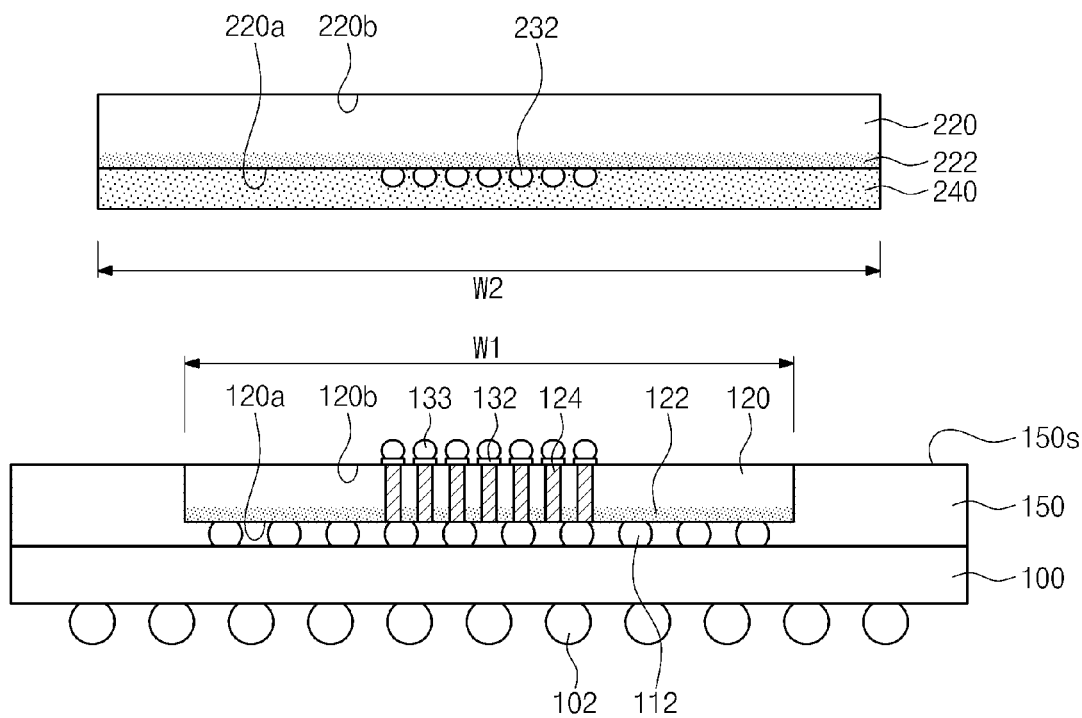

Referring to FIG. 1C, a second semiconductor chip 220 may be stacked on the first semiconductor chip 120. The second semiconductor chip 220 may have an active surface 220a and a non-active surface 220b opposite to the active surface 220a. A second circuit layer 222 may be formed on the active surface 220a of the second semiconductor chip 220. The second circuit layer 222 may be formed of multiple layers (e.g., patterned insulating layers and conductive layers) on a semiconductor substrate (such as on a crystalline substrate of silicon, silicon germanium, etc.), as is typical in manufacturing semiconductor devices. A passivation layer (not shown) may cover the second circuit layer 222. In some embodiments, the second semiconductor chip 220 may be a memory chip. The second semiconductor chip 220 may include second interconnecting terminals 232 (e.g., solder bumps such as solder balls or pillars) that are provided on the active surface 220a so as to be electrically connected to the second circuit layer 222. The second interconnecting terminals 232 may be intensively disposed in a central region 220c of the active surface 220a of the second semiconductor chip 220, as illustrated in FIG. 2B. The second interconnecting terminals 232 may be vertically aligned with the through-electrodes 124. In some embodiments, the second interconnecting terminals 232 may be vertically aligned with back surface pads 132, some or all of which are offset from (i.e., not vertically aligned with) through-electrodes 124 to which they are electrically connected (e.g., through a redistribution layer on the non-active surface 120b (not shown).

The second semiconductor chip 220 may have a second width W2 greater than the first width W1 of the first semiconductor chip 120. In some embodiments, the second semiconductor chip 220 may have four sidewalls 220w, 220x, 220y, and 220z, as illustrated in FIG. 2B. In this example, at least a pair of sidewalls 220w and 220x opposite to each other among the four sidewalls 220w, 220x, 220y, and 220z, may have a length equal to the second width W2.

The second semiconductor chip 220 may be stacked on the first semiconductor chip 120 in a face-down configuration so that its active surface 220a faces the package substrate 100. Thus, the active surface 220a of the second semiconductor chip 220 may face the non-active surface 120b of the first semiconductor chip 120. In some embodiments, additional solder bumps 133 may be further attached on the back-surface pads 132 and be used to connect to the second semiconductor chip 220 (e.g., without use of solder bumps as interconnecting terminals 232 or via solder bumps as interconnecting terminals 232).

According to the present embodiment, a non-conductive film 240 may be bonded to the active surface 220a of the second semiconductor chip 220. The non-conductive film 240 may be applied to surface 220a from a roll of film or the film 240 may be created by applying a paste to surface 220a. The non-conductive film 240 may be an epoxy-based adhesive film that does not contain conductive particles. The non-conductive film 240 prior to its thermal compression may have a thickness greater than a protruding length of the second interconnecting terminals 232. For example, the non-conductive film 240 may cover and encapsulate solder bumps 232 when terminals 232 are embodied as solder bumps. In alternative examples, the non-conductive film 240 may be applied to surface 120b of the first semiconductor chip 120 to cover pads 132 or to cover both pads 132 and bumps 133 (e.g., having a thickness greater than a height of the bumps 133). The non-conductive film 240 may be applied to surface 120b of the first semiconductor chip 120 instead of or in addition to the use of the non-conductive film 240 on surface 220a of second semiconductor chip 220.

Figure 1D:
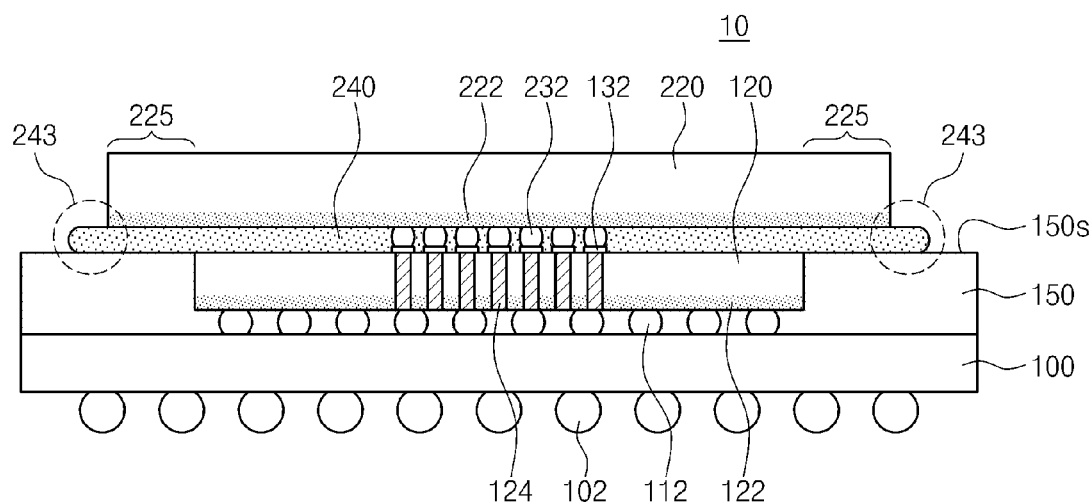

Referring to FIG. 1D, the non-conductive film 240 may be thermally compressed to electrically connect the second semiconductor chip 220 to the first semiconductor chip 120. As a result, a semiconductor package 10 may be fabricated. For example, a pressure higher than an atmospheric pressure (e.g., 0.1 MPa) may be applied to the non-conductive film 240 at a temperature higher than a room temperature (e.g., 25° C.) to thermally compress the non-conductive film 240. The non-conductive film 240 may be compressed to electrically connect the second interconnecting terminals 232 to the back-surface pads 132, so the second semiconductor chip 220 may be electrically connected to the first semiconductor chip 120. By the thermo-compression, the non-conductive film 240 may be thinned to have an extended portion 243 that protrudes from the sidewall of the second semiconductor chip 220. As can be seen by comparing FIGS. 1C and 1D, the size of the non-conductive film 240 has been made larger due to the thermal compression, enlarging from a width of W2 (in the horizontal direction) to flow onto the surface of molding layer 150. The extended portion 243 of the non-conductive film may be supported by the top surface 150s of the molding layer 150.

In some examples, during the thermal compression of the non-conductive film 240, temperature of the non-conductive film 240 may be raised to soften the non-conductive film 240 and allow the non-conductive film 240 to begin to flow. For example, the temperature may be raised to about 160 degrees Celcius to allow the non-conductive film 240 to be thinned via compression so that terminals 232 may contact solder bumps 133 (or back surface pads 132 when solder bumps 133 are not used). The temperature maybe briefly raised to allow solder bump reflow to join terminals 232 and bumps 133 (or pads 132).

When the non-conductive film 240 without conductive particles is used, a fine pitch of the second interconnecting terminals 232 may be realized without an electrical short between the second interconnecting terminals 232 adjacent to each other. In addition, since the second interconnecting terminals 232 are in direct contact with the back-surface pads 132, a contact resistance therebetween may be reduced. The non-conductive film 240 may act as an underfill layer that fills a space between the first and second semiconductor chips 120 and 220, thereby increasing or improving mechanical endurance of the second interconnecting terminals 232.

The second width W2 of the second semiconductor chip 220 may be greater than the first width W1 of the first semiconductor chip 120 as described with reference to FIG. 1C, so the second semiconductor chip 220 may have an overhang 225 that protrudes from the sidewall of the first semiconductor chip 120. In addition, the non-conductive film 240 may further protrude beyond the overhang 225 from the sidewall of the second semiconductor chip 220.

In some embodiments, the overhang 225 may have a ring shape extending around the first semiconductor chip 120, as illustrated in FIG. 2C. In other embodiments, the overhang 225 may extend over first opposing sidewalls of the first semiconductor chip 120 but not exist with respect to second opposing sidewalls of the first semiconductor chip 120.

According to the present embodiment, since the top surface 150s of the molding layer 150 supports the overhang 225, the second semiconductor chip 220 may have its lower surface (here, active surface 220a) fully supported. The semiconductor package 10 may have substantially no overhang structure.

FIGS. 3A and 3B illustrate a comparative example. Unlike the embodiment of FIGS. 1A-1D and 2A-2C, as shown in FIG. 3A, the molding layer is formed on the package substrate 100. The second semiconductor chip 220 may be stacked on the first semiconductor chip 120. In this case, a portion of the non-conductive film 240 that is not supported by the first semiconductor chip 120 may not be compressed when the portion of the remaining non-conductive film 240 is thermally compressed, as illustrated in FIG. 3B.

Thus, the non-conductive film 240 may have a portion 242 that droops toward the package substrate 100, and/or the second semiconductor chip 220 may obtain an inclined position after the compression step. In addition, if an underfill layer is later formed between the package substrate 100 and the first semiconductor chip 120 or a molding layer is later formed on the package substrate 100 to cover the first and second semiconductor chips 120 and 220, the drooping portion 242 of the non-conductive film 240 may block a flow of a molding material or an underfill material (e.g., such as preventing portions of a space under chip 122 from being filled). Thus, the formation of the underfill layer or the molding layer may be deteriorated.

According to the present embodiment, even though the size of the second semiconductor chip 220 is greater than the first semiconductor chip 120 (either overlapping the second semiconductor chip 220 in just one horizontal directions or fully overlapping the semiconductor chip, e.g., in two horizontal directions that are perpendicular to each other), the molding layer 150 may support the non-conductive film 240 and the second semiconductor chip 220 for those portions that extend past the first semiconductor chip 120. It is possible to prevent the drooping problem of the non-conductive film 240 and the inclining problem of the second semiconductor chip 220 as illustrated in FIG. 3B.

It will be appreciated that the embodiment described herein may be modified where the second semiconductor chip 220 has only one of two opposing sides extending past the first semiconductor chip 120 in an overhanging manner. For example, the second semiconductor chip 220 illustrated in FIG. 1D may be replaced by two side-by-side semiconductor chips that together occupy the space occupied by second semiconductor chip 220 so that each of these side-by-side semiconductor chips have an edge overlying the first semiconductor chip 120 and an opposite edge extending in an overhanging manner past an edge of the first semiconductor chip 120. As another example, the second semiconductor chip 220 may be stacked in a "stair-step" fashion so that one edge of the second semiconductor chip 220 overlies the first semiconductor chip 120 and one edge extends in an overhanging manner pas an edge of the first semiconductor chip 120. In both of these alternative examples, it will be recognized that the second semiconductor chip 220 may have a horizontal dimension greater than a corresponding horizontal dimension of the first semiconductor chip in a direction in which the overhang extends (e.g., the chip(s) mounted on the first semiconductor chips may be the same size or smaller than the first semiconductor chip 120 with respect to the direction in which an overhang of these chip(s) or with respect to all horizontal dimensions).

In addition, since the molding layer 150 has a structure exposing the non-active surface 120b of the first semiconductor chip 120, heat generated from the first semiconductor chip 120 may be easily transferred outside of the package. In other words, the semiconductor package 10 may have an improved heat release characteristic.

FIGS. 4A to 4E are cross-sectional views illustrating modified embodiments of FIG. 1D.

Figure 4A:
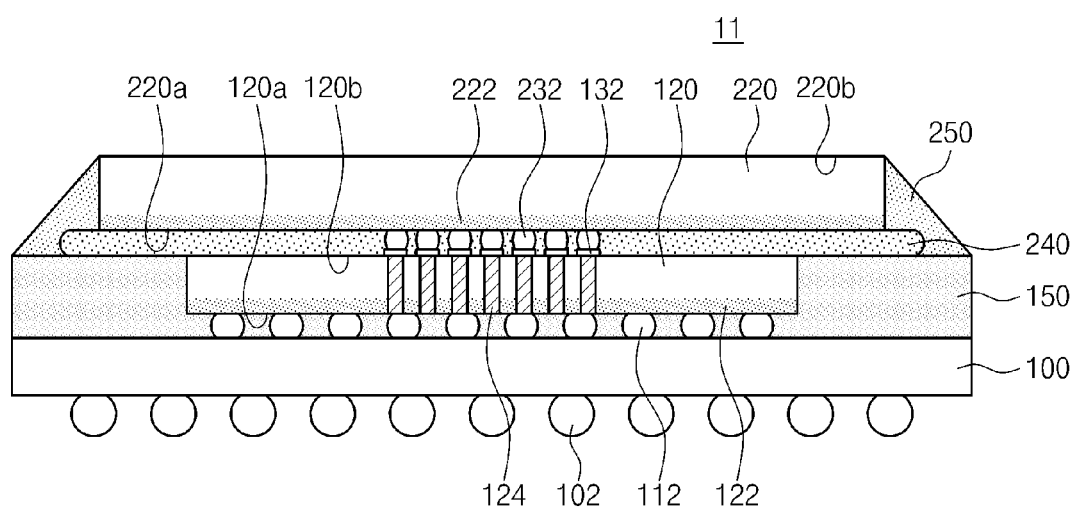
FIGS. 4A to 4E are cross-sectional views illustrating modified embodiments of FIG. 1D.

Referring to FIG. 4A, an underfill or second molding layer 250 may be further formed on the molding layer 150 to fabricate a semiconductor package 11. The non-active surface 220b of the second semiconductor chip 220 may be exposed. In other embodiments, an additional molding layer may be formed to completely cover the second semiconductor chip 220.

Figure 4B:
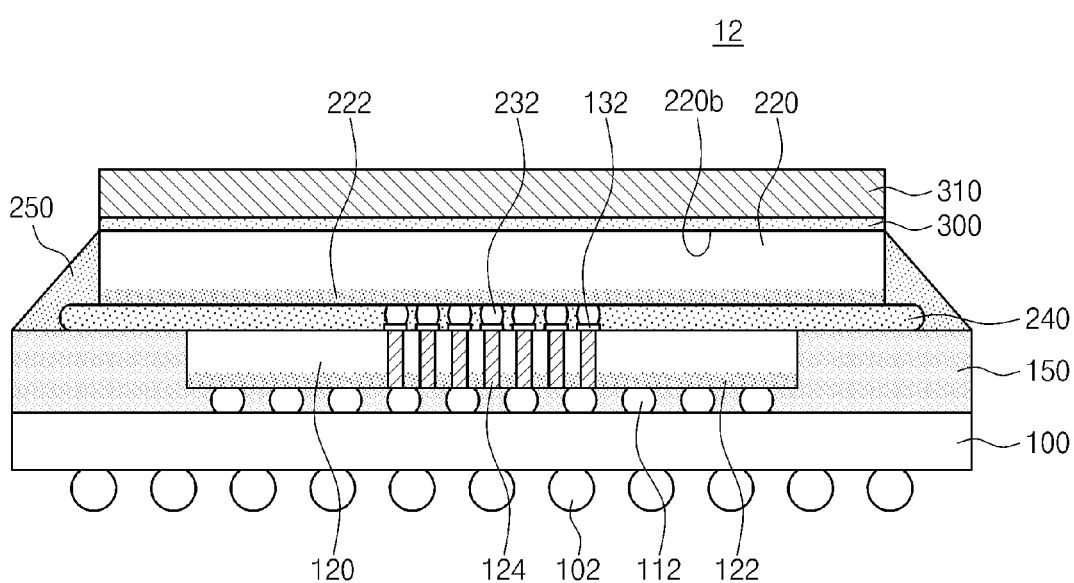

Referring to FIG. 4B, an underfill or second molding layer 250 may be further formed on the molding layer 150 and along sides of second semiconductor chip 220. The second molding layer 25 may leave all or a substantial portion of the non-active surface 220b (top surface) of the second semiconductor chip 220b exposed. A heat transfer layer 300 (e.g., a thermal interface material (TIM) layer) and a heat radiating layer 310 may be further formed on the non-active surface 220b of the second semiconductor chip 220. Thus, a semiconductor package 12 of FIG. 4B may be fabricated. The heat radiating layer 310 may include a conductive material such as copper or aluminum. The heat transfer layer 300 may be formed of thermal grease, a phase change material, or a thermal conductive elastomer. The heat transfer layer 300 may reduce a contact resistance between the heat radiating layer 310 and the second semiconductor chip 220.

Figure 4C:
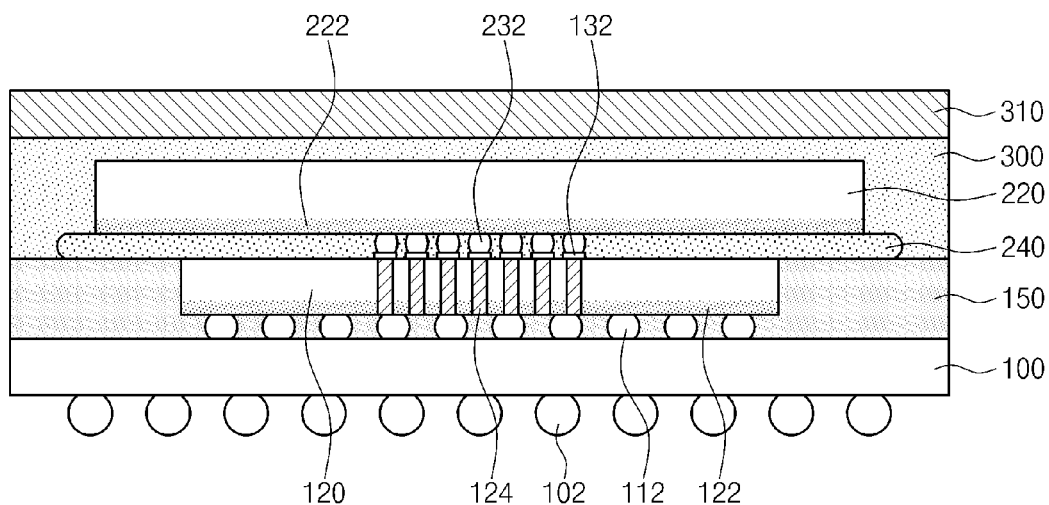

Referring to FIG. 4C, a heat transfer layer 300 may be a molding layer formed on sides and a top surface of second semiconductor chip 220 and a heat radiating layer 310 may be further formed on the heat transfer layer 300 to fabricate a semiconductor package 13. The heat transfer layer 300 may surround the second semiconductor chip 220, so heat generated from the semiconductor package 13 may be easily exhausted. The heat radiating layer 310 may accelerate the heat radiating from the semiconductor package 13.

Figure 4D:
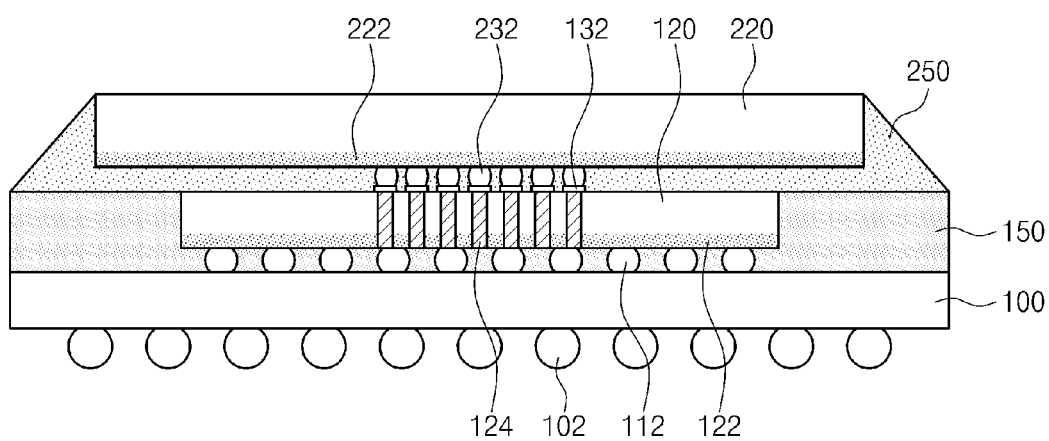

Referring to FIG. 4D, the non-conductive film 240 may not be bonded to the second semiconductor chip 220 when the second semiconductor chip 220 is stacked on the first semiconductor chip 120 as illustrated in FIG. 1C. In the present embodiment, an underfill layer 250 may be further formed on the molding layer 150 to fabricate a semiconductor package 14. The underfill layer 250 may extend under second semiconductor chip 220 to encapsulate terminals (e.g., solder bumps) 232 and along sidewalls of second semiconductor chip 220.

Figure 4E:
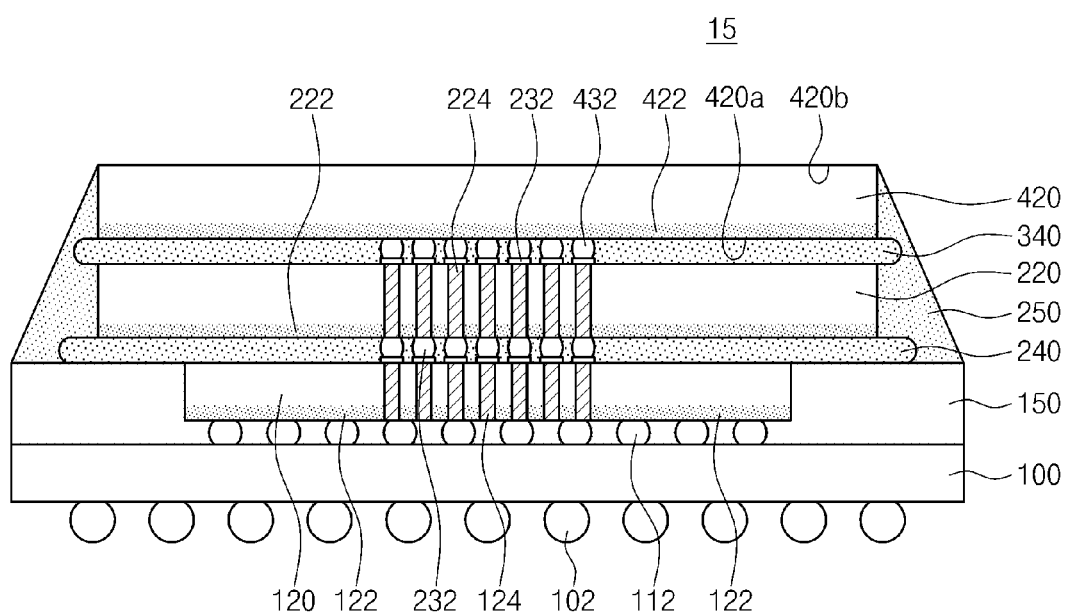

Referring to FIG. 4E, a third semiconductor chip 420 may be further stacked on the second semiconductor chip 220 to fabricate a semiconductor package 15. An underfill layer 250 may be further formed on the molding layer 150 to cover sidewalls of the second and third semiconductor chips 220 and 420. In the present embodiment, the second semiconductor chip 220 may further include second through-electrodes 224 penetrating the second semiconductor chip 220 and second back-surface pads 232 in contact with the second through-electrodes 224.

The third semiconductor chip 420 may include an active surface 420a on which a third circuit layer 422 is formed, and a non-active surface 420b opposite to the active surface 420a. For example, the third semiconductor chip 420 may be a memory chip. The third semiconductor chip 420 may be stacked on the second semiconductor chip 220 by a face-down mounting method in such a way that its active surface 420a faces the second semiconductor chip 220. A size of the third semiconductor chip 420 may be equal or similar to that of the second semiconductor chip 220.

Third interconnecting terminals 432 (e.g., solder bumps) and a second non-conductive film 340 may be provided on the active surface 420a of the third semiconductor chip 420. The third interconnecting terminals 432 may be connected to the second through-electrodes 224. The second non-conductive film 340 may be thermally compressed. In some embodiments, an additional mold layer may be further formed to cover the non-active surface 420b of the third semiconductor chip 420.

The second semiconductor chip 220 may be stacked on the first semiconductor chip 120 by the face-down mounting method in such a way that the second circuit layer 222 faces the first semiconductor chip 120. In other embodiments, the second semiconductor chip 220 may be stacked on the first semiconductor chip 120 by a face-up mounting method in such a way that the second circuit layer 222 faces the third semiconductor chip 420. Elements of the third semiconductor chip 420 and connections thereto may be the same as those described herein with respect to second semiconductor chip 220. Alternatives described herein with respect to second semiconductor chip 220 and its connections are also applicable to the corresponding elements of or associated with the third semiconductor chip 420. It will also be appreciated that more than two chips may be stacked on the first semiconductor chip 120 and that semiconductor chips stacked on the first semiconductor chip may also have different sizes (and may have an associated underfill formed like underfill 150 when the horizontal dimension of an upper semiconductor chip is greater than or has an edge extending past an edge of the semiconductor chip to which it is mounted to create an overhang).

Figure 5:
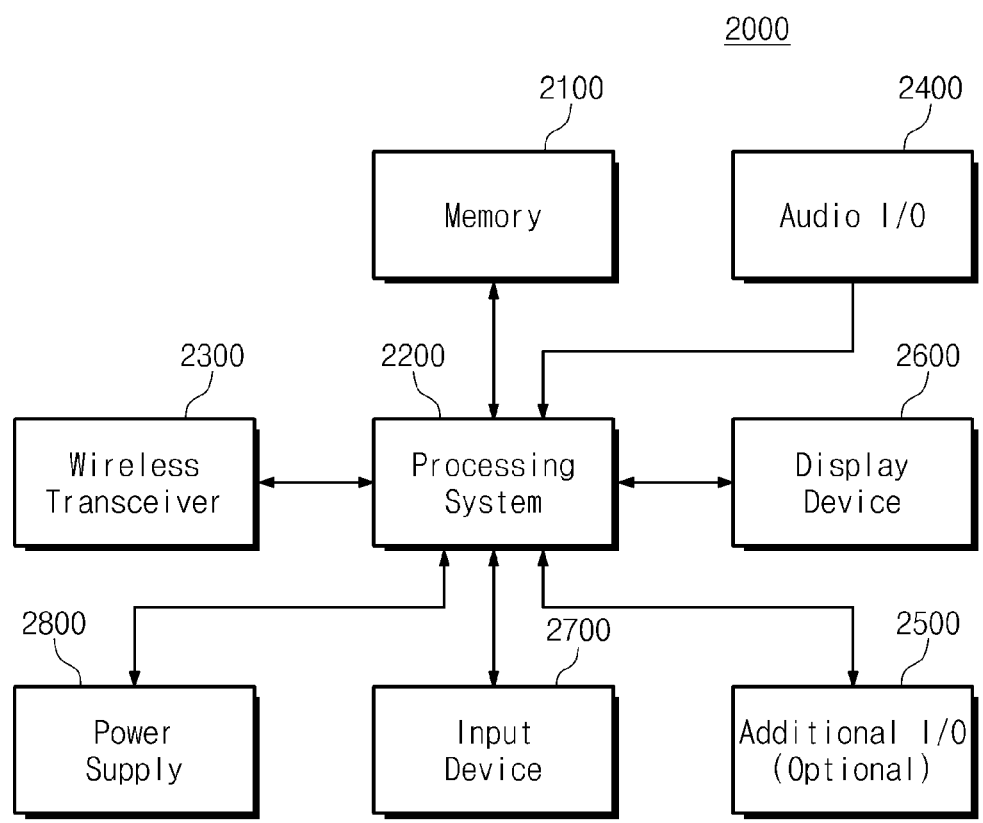
FIG. 5 is a schematic block diagram illustrating a mobile device according to embodiments of the inventive concepts.

FIG. 5 is a schematic block diagram illustrating a mobile device including according to embodiments of the inventive concepts.

Referring to FIG. 5, a mobile device 2000 may include a memory 2100, a processing system 2200, a wireless transceiver 2300, an audio input/output (I/O) device 2400, a display device 2600, an input device 2700, and a power supply 2800. In some embodiments, the mobile device 2000 may further include an additional input/output (I/O) device 2500. The processing system 2200 may include at least one of the semiconductor packages 10, 11, 12, 13, 14 and 15 according to embodiments of the inventive concepts described herein. The mobile device 200 may be applied to, for example, a portable phone or a tablet computer.

According to embodiments of the inventive concepts, after the lower semiconductor chip is mounted on the package substrate and the molding layer is then formed, the upper semiconductor chip is stacked on the lower semiconductor chip. Thus, even though the upper semiconductor chip having the large size is stacked on the lower semiconductor chip having the small size to have the overhang, the molding layer molding the lower semiconductor chip may support the overhang structure of the upper semiconductor chip.

In addition, even though the non-conductive film is disposed between the upper and lower semiconductor chips, the molding layer may prevent the non-conductive film from drooping.

As a result, the semiconductor chips having different sizes may be stacked regardless of occurrence of the overhang, so a yield of the semiconductor packages may be improved.

While the inventive concepts have been described with reference to example embodiments, it will be apparent to those skilled in the art that various changes and modifications may be made without departing from the spirits and scopes of the inventive concepts. Therefore, it should be understood that the aforementioned embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for fabricating a semiconductor package, the method comprising:
    mounting a first semiconductor chip on a package substrate, the first semiconductor chip comprising a first front surface, a first back surface opposite to the first front surface, and through-electrodes at least partially penetrating the first semiconductor chip;
    forming a first molding layer on the package substrate, the first molding layer extending along a sidewall of the first semiconductor chip, surrounding the first semiconductor chip, exposing the first back surface of the first semiconductor chip and having an upper surface substantially coplanar with the first back surface of the first semiconductor chip;
    stacking a second semiconductor chip on the first semiconductor chip, the second semiconductor chip comprising a second front surface, a second back surface opposite to the second front surface, and interconnecting terminals provided on the second front surface;
    providing a non-conductive film between the second front surface of the second semiconductor chip and the first back surface of the first semiconductor chip; and
    electrically connecting the second semiconductor chip to the first semiconductor chip by thermally compressing the non-conductive film,
    wherein a size of the second semiconductor chip is greater than that of the first semiconductor chip such that the second semiconductor chip has an overhang extending over the sidewall of the first semiconductor chip, and
    wherein the thermally compressed non-conductive film protrudes beyond the overhang of the second semiconductor chip and is supported by the first molding layer.

2. The method of claim 1, wherein mounting the first semiconductor chip comprises:
    mounting the first semiconductor chip on the package substrate by a face-down mounting method in such a way that the first front surface faces the package substrate,
    wherein the second semiconductor chip is electrically connected to the package substrate through the through-electrodes.

3. The method of claim 2, wherein mounting the first semiconductor chip further comprises:
    providing interconnecting terminals, which are connected to the through-electrodes, between the first semiconductor chip and the package substrate.

4. The method of claim 2,
    wherein the first molding layer fills a space between the package substrate and the first semiconductor chip and exposes the first back surface,
    wherein the thermally compressed non-conductive film comprises an extended portion extending onto the upper surface of the first molding layer.

5. The method of claim 2, wherein stacking the second semiconductor chip comprises:
    stacking the second semiconductor chip on the first back surface by a face-down mounting method in such a way that the second front surface faces the first back surface.

6. The method of claim 5, wherein providing the non-conductive film comprises:
    adhering a non-conductive adhesive film, which has a thickness greater than a protruding length of the interconnecting terminals, to the second front surface prior to stacking the second semiconductor chip on the first semiconductor chip.

7. The method of claim 6, wherein electrically connecting the second semiconductor chip to the first semiconductor chip comprises:
    electrically connecting the interconnecting terminals to the through-electrodes by thermally compressing the non-conductive adhesive film,
    wherein the interconnecting terminals penetrate the thermally compressed non-conductive adhesive film so as to be electrically connected to the through-electrodes.

8. The method of claim 1, wherein the second semiconductor chip further comprises second through-electrodes at least partially penetrating the second semiconductor chip, the method further comprising:
    stacking a third semiconductor chip on the second semiconductor chip, the third semiconductor chip comprising: a third front surface; a third back surface opposite to the third front surface; and second interconnecting terminals disposed on the third front surface;
    providing a second non-conductive film between the second back surface of the second semiconductor chip and the third front surface of the third semiconductor chip; and
    electrically connecting the third semiconductor chip to the second semiconductor chip by thermally compressing the second non-conductive film.

9. A method for fabricating a semiconductor package, the method comprising:
    providing a package substrate;
    mounting a non-memory chip on the package substrate, the non-memory chip comprising: a first active surface; a first non-active surface opposite to the first active surface; and through-electrodes at least partially penetrating the non-memory chip, and the non-memory chip mounted on the package substrate in so that the first active surface faces the package substrate;
    forming a first molding layer surrounding the non-memory chip on the package substrate, the first molding layer having a surface substantially coplanar with the first non-active surface;
    stacking a memory chip on the first non-active surface of the non-memory chip, the memory chip being provided with, prior to the stacking, a second active surface; interconnecting terminals provided on the second active surface; and a second non-active surface opposite to the second active surface, and a non-conductive film having a uniform thickness adhered to the second active surface to cover the interconnecting terminals; and
    electrically connecting the memory chip to the non-memory chip by thermally compressing the non-conductive film,
    wherein, at least with respect to a first direction, a size of the memory chip is greater than that of the non-memory chip such that the memory chip comprises an overhang portion extending past a sidewall of the non-memory chip,
    wherein, at least with respect to the first direction, a size of the thermally compressed non-conductive film is greater than that of the memory chip such that the thermally compressed non-conductive film has an extended portion not located under the second semiconductor chip past the overhang, and
    wherein the extended portion is supported by the surface of the first molding layer.

10. The method of claim 9, further comprising:
forming second molding layer on the surface of the first molding layer,
wherein the second molding layer surrounds the memory chip and exposes the second non-active surface.

11. The method of claim 10, further comprising:
forming a heat transfer layer on the second non-active surface; and
forming a heat radiating layer on the heat transfer layer.

12. The method of claim 9, further comprising:
forming a heat transfer layer molding the memory chip on the surface of the first molding layer; and
forming a heat radiating layer on the heat transfer layer.

13. A method of manufacturing a semiconductor package comprising:
mounting a first semiconductor chip on a package substrate;
forming a molding material at sides of the first semiconductor chip so that top surfaces of the molding material and the first semiconductor chip lying within 5 um of a first plane;
mounting a second semiconductor chip on the first semiconductor chip with a non-conductive film disposed therebetween; and
performing a thermal compression to apply pressure and heat to the non-conductive film to allow the non-conductive film to thin and flow onto the molding material,
wherein the non-conductive material has a constant thickness, with respect to a vertical direction, between facing surfaces of the first semiconductor chip and the second semiconductor chip.

14. The method of claim 13,
wherein the second semiconductor chip comprises solder bumps attached to a bottom surface,
wherein prior to the mounting step, the non-conductive film is disposed over the solder bumps, and
wherein during the thermal compression, the solder bumps extend through a surface of the non-conductive film.

15. The method of claim 14,
wherein the first semiconductor chip includes pads on the top surface and during the thermal compression, the solder bumps on the second semiconductor chip are connected to the pads.

16. The method of claim 15, wherein the solder bumps of the second semiconductor chip are connected to the pads through other solder bumps on the first semiconductor chip.

17. The method of claim 15, wherein the solder bumps of the second semiconductor chip are directly connected to the pads of the first semiconductor chip.

18. The method of claim 15, wherein the molding material extends from the sides of the first semiconductor chip to sides of the package substrate.

19. The method of claim 18, wherein the sides of the package substrate are in vertical alignment with sides of the molding material.

20. The method of claim 1, wherein a thickness of the non-conductive film between the first semiconductor chip and second semiconductor chip is substantially the same as a second thickness of the non-conductive film between the first molding layer and the second semiconductor chip.

* * * * *